United States Patent [19]

Sabet-Peyman et al.

[11] Patent Number: 4,827,229
[45] Date of Patent: May 2, 1989

[54] BROAD BAND BULK ACOUSTIC WAVE SPECTRUM ANALYZER/CHANNELIZER

[75] Inventors: Farhang Sabet-Peyman, San Jose; I-Cheng Chang, Sunnyvale, both of Calif.

[73] Assignee: Litton Systems, Inc., Beverly Hills, Calif.

[21] Appl. No.: 68,156

[22] Filed: Jun. 30, 1987

[51] Int. Cl.⁴ .................. H03H 9/54; H03H 9/13; H03H 11/34

[52] U.S. Cl. .................. 333/187; 333/133; 333/142

[58] Field of Search ............... 333/150–155, 333/193–196, 142, 149, 186–188, 132–133; 364/821–823; 310/320–321, 335, , 357, 366–369, 371

[56] References Cited

U.S. PATENT DOCUMENTS

| | | | |
|---|---|---|---|
| 4,329,876 | 5/1982 | Chen et al. | 73/618 |
| 4,349,794 | 9/1982 | Kagiwada et al. | 333/141 |
| 4,385,255 | 5/1983 | Yamaguchi et al. | 310/335 |
| 4,390,247 | 6/1983 | Freyre | 350/358 |
| 4,523,293 | 6/1985 | Auld et al. | 364/821 |
| 4,542,653 | 9/1985 | Liu | 367/105 |
| 4,604,543 | 8/1986 | Umemura et al. | 310/334 |
| 4,609,890 | 9/1986 | Oates et al. | 333/187 |
| 4,614,919 | 9/1986 | Floyd | 333/133 |
| 4,643,028 | 2/1987 | Kondo et al. | 73/625 |
| 4,644,795 | 2/1987 | Augustine | 73/625 |
| 4,662,223 | 5/1987 | Riley et al. | 73/626 |

OTHER PUBLICATIONS

"Beam Scanning and Focussing of Bulk Acoustic Waves" by F. Sabet-Peyman, R. T. Weverka, I. C. Chang and P. Katzka, 1984, *IEEE Ultrasonics Symposium*, pp. 424–429.

"Diffraction and Detection of Bulk Acoustic Waves" by F. Sabet-Peyman and I. C. Chang, *Proceedings of SPIE*-The International Society for Optical Engineering pp. 58–65, "Optical Technology for Microwave Applications", Shi-Kay Yao, Editor, Apr. 9–10, 1985, Arlington, Virginia.

"Focused Acoustic Wave Channelizer" by Dennis R. Pope, Andrew M. Bardos, Marc H. Popek, and Manhar L. Stah, Proceedings of SPIE-The International Society for Optical Engineering, Dennis R. Pope, Editor, Apr. 3–4, 1986, Orlando, Florida.

*Primary Examiner*—Marvin L. Nussbaum
*Attorney, Agent, or Firm*—Roy L. Brown

[57] ABSTRACT

A bulk acoustic wave spectrum analyzer and channelizer, using bulk acoustic wave beams in a body of material having the property of conducting bulk acoustic wave beams, including acoustically reflecting surfaces. An input transducer is positioned upon one surface of the body for launching acoustic beams into the body. At least one output transducer set, including a plurality of aligned, juxtaposed electrodes are placed on the outer surfaces of each of the output transducers of the transducer sets. A frequency responsive means for steering acoustic beams launched from said input transducer into said body, in response to the frequencies of received radio frequency signals, focuses the beams onto frequency dependent positions and transducers of the output transducer set to produce usable electrical output signals upon no more than two adjacent electrodes on each of the output transducer sets for each frequency of received signals, such particular energized electrodes being measures of the frequency slots that include the frequencies of input radio frequency signals received by the input transducer.

14 Claims, 7 Drawing Sheets

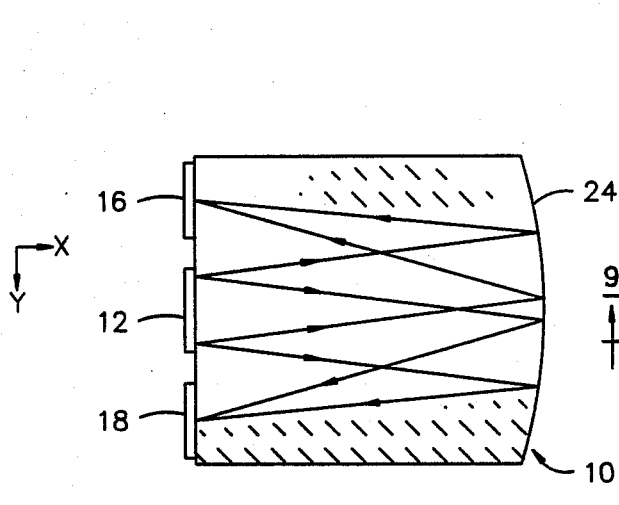
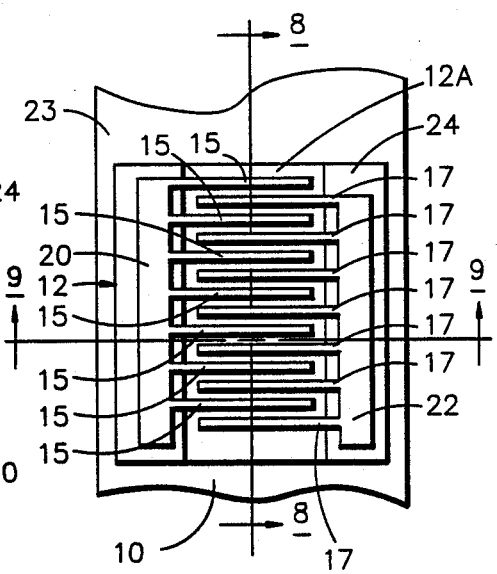
FIG. 6   FIG. 7
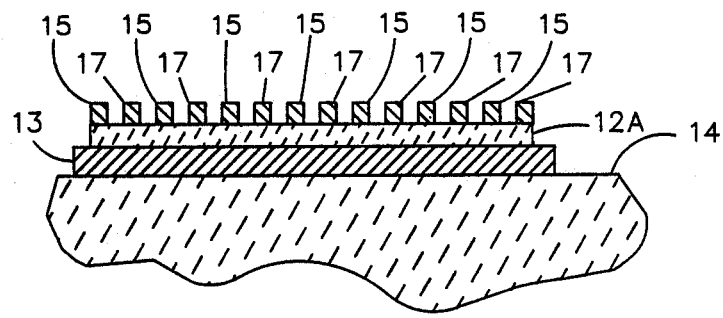
FIG. 8

BROAD BAND BULK ACOUSTIC WAVE SPECTRUM ANALYZER/CHANNELIZER

RELATED APPLICATIONS

This application is related to copending patent application, Ser. No. 070,891, entitled, "Acoustic Transducer", and having the same filing date, invented by Farhang Sabet-Peyman, and assigned to the same assignee.

This application is also related to copending patent application, Ser. No. 070,839 and now U.S. Pat. No. 4,801,941, entitled "Angle of Arrival Processor Using Bulk Acoustic Wave", and having the same filing date, invented by Farhang Sabet-Peyman, and assigned to the same assignee.

BACKGROUND OF THE INVENTION

This invention relates generally to high frequency signal processing devices and, more particularly, to devices which utilize bulk acoustic waves for such processing.

Various devices are used to process signals at radio frequencies. Some devices use surface acoustic waves (hereinafter sometimes called SAW) for analog signal processing, such as filtering, spectrum analyzing, correlation, convolution, and pulse compression. The SAW devices are relatively simple and inexpensive to fabricate, and they have the advantages of being both passive and compact. A typical device is described, for example, in U.S. Pat. No. 4,101,965, which issued on July 18, 1978 to K. Ingebrigtsen et al.

Because of the low velocity of surface acoustic waves along the surface of a crystal, excessively long interaction times between the received signals and the apparatus are accommodated on a short substrate. Bandwidths of up to about 200 Megahertz (MHz) are achieved. Such bandwidth and interaction time characteristics make SAW devices highly useful as signal processing devices. However, the bandwidth of a SAW device is fixed at about 20% of its band center frequency. To increase the bandwidth of a SAW device, the center frequency must be increased. But, because the acoustic wave is dispersed as it travels along the crystal surface, the center frequencies of existing SAW devices have a practical upper limit of about 1 GHz, and its bandwidth is limited to about 200 MHz. SAW propagation can often be susceptible to surface damage and attenuation by the crystal material. Such attenuation increases as the square of the frequency.

Advances in miniaturizing electronic circuits produce no significant decreases in weight and volume of SAW devices.

Because of the frequency limitations of SAW devices, use of microwave superconducting strip transmission lines has been suggested, for example, in the article "Passive Superconducting Microwave Circuits For 2–20 GHz Bandwidth Analog Signal Processing" by J. T. Lynch et al., Proceeding of the MTT Symposium, 1982. Such superconducting devices, however, currently operate only at extremely low temperatures (down to as low as about 4° K.), and require a multistage refrigeration system which substantially increases the weight, volume and cost of the overall device and requires significant power to operate. Moreover, they have a time delay, in achieving signal processing operation, after the refrigeration system has been made operative. Superconducting strip lines typically have more manufacturing defects than SAW devices, because fabricating superconducting strip lines is extremely difficult and complex than fabricating SAW devices.

In operation, the high velocity of electromagnetic waves in a superconducting strip transmission line, compared to the velocity of SAW waves, severely reduces the achievable interaction time between the acoustic signal and apparatus of the same path length.

It is important to achieve high frequency operation without the disadvantages of either the SAW device or the microwave superconducting strip transmission device, and without a need for refrigeration, at reasonable, size, cost and with a reasonable ease of fabrication. To that end, bulk acoustic wave (hereinafter sometimes called BAW) apparatus have been conceived.

Bulk acoustic waves are used in a body which supports acoustic transmission through its interior, (hereinafter called BAW body) rather than on its surface. A part of the interior of the BAW body may be processed to have a plurality of regions which have varying acoustic impedance characteristics. The BAW signal interacts with such regions, for example by reflection and refraction, and the apparatus may be designed to process the signals delivered to the BAW apparatus. Acoustical Bulk Wave Processing Devices may, for example, use a reflecting surface which may be curved or flat. It may also use diffraction gratings that steer and focus or spread acoustic waves. See U.S. Pat. No. 4,609,890, which issued Sept. 2, 1986 to Oates et al for "Bulk Acoustic Wave Signal Processing Devices."

Diffraction gratings may be used with BAW devices to steer the acoustic beam. A diffraction grating may be inscribed, etched, or otherwise placed on the surface of the BAW body. Preferably, because of the needed close line spacing, it may be formed by a computer controlled holographic process to control the dispersed acoustic beam and suppress higher diffraction orders. A typical grating, and process for making it, are taught and shown in U.S. Pat. No. 4,547,037 which issued Oct. 15, 1985 to Steven K. Case for a "Holographic Method for Producing Desired Wavefront Transformations."

The profile of the lands and grooves of an efficient diffraction grating may be of a number of shapes. One preferred embodiment of such a grating has a sinusoidal profile. Another embodiment has a rectangular profile. Still another embodiment has a saw-toothed profile.

A diffraction grating having a rectangular profile, and the dispersion of an acoustic or sonic wave is shown in U.S. Pat. No. 4,329,876 which issued to W. H. Chen and E. G. Lean on May 18, 1982 for a "Method and Apparatus for Acoustic Scanning Using Scattering of Bulk Waves by an Acoustic Grating".

The signal density and the number of strange or exotically configured signals are increasing. To achieve a high probability of intercept and identification such signals requires special receivers with very wide instantaneous radio frequency bandwidth, and high sensitivity over a wide dynamic range of received signal intensity.

Crystal video, superheterodyne, instantaneous frequency measurement, channelized, compressive, and Bragg Cell receivers are most commonly used. Channelized receivers are among the best performing of these receivers.

A channelized receiver delivers a radio frequency input signal, preferably amplified, to a first bank of bandpass filters, with their input terminals in parallel and with slightly overlapping passband boundaries between adjacent filters. Each filter is designed to pass signals within a predetermined passband of frequencies.

The first set of filters divides the input frequency spectrum into overlapping frequency "bands". Each filter of the first set of filters delivers its band of signals into the parallel input terminals of a second set of bandpass filters which further divide those bands into a plurality of slightly overlapping frequency "channels". Each filter of each of the second sets of filters delivers its channel of signals into the parallel input terminals of a third set of bandpass filters which further divide those channels into a plurality of overlapping frequency "slots".

The processing of multiple simultaneously-received signals at different frequencies over a wide bandwidth allows the isolation of weak signals into different frequency slots for further analysis while rejecting other uninteresting, known, or jamming signals. Separating the signals on a real-time scale facilitates detection and analysis of frequency-hopping signals and the reception of communications on time-varying, multiple-frequency channels. Compared to other mentioned types of apparatus, a channelized receiver has a high probability-of-intercepting pulsed radio frequency signals and a short acquisition time.

Because of the large quantity of data which may flow through a channelized receiver, it needs a large signal processor. High-speed programs and circuits, together with a large amount of power are needed.

BRIEF DESCRIPTION OF THE INVENTION

Several embodiments of the BAW spectrum analyzer and frequency channelizer of this invention are described in an unclassified technical report, dated April 1986, delivered in October 1986. Report number 10752-DKS by F. Sabet-Peyman, K. Chau, C. Wright and I. C. Chang, entitled, "Bulk Acoustic Wave Frequency Channelizer Phase I," was prepared for the United States Navy, Naval Research Laboratory under Contract N00014-85-C-2588 with the Applied Technology Division Itek Incorporated.

The Spectrum Analyzer and Channelizer of this invention rapidly identifies the frequency of incoming radio frequency signals which might be, for example, from a communications system or from a radar system.

It is important that the BAW body used in the invention be of a material that efficiently carries Bulk Acoustic Waves. A BAW body might be crystalline or amorphous. For example, it might be made of lithium niobiate, spinel, yttrium-aluminum-garnet, yttrium-gallium-garnet, or yttrium-iron-garnet.

Incoming radio frequency electrical signals are delivered to an input acoustic transducer which is in intimate contact with the BAW body. The input transducer which changes the electrical signals to acoustic signals is preferably a piezoelectric transducer which may be fabricated, for example, of a platelet of lithium niobiate. Instead of using platelets, the transducer may be grown directly or sputtered onto the BAW body. The sputtered transducer may, for example, be of zinc oxide.

In addition to the input transducer, the BAW body carries at least one reflective surface, beam steering means such as a phased-array, or a dispersive grating, and at least one output transducer having a plurality of collecting electrodes, each assigned to a different frequency slot.

The input transducer and the reflective surface are positioned so that the acoustic wave beam from the transducer is directed at the reflective surface.

The reflective surface is an interface between the BAW body and the surrounding air. It may alternatively, be a boundary between the BAW body and some other material or other BAW body having different acoustical characteristics. The other material could be a solid, liquid or gas. It could be the atmosphere, or a vacuum. Further, the reflecting boundary may have variable reflectivity. In one preferred embodiment, the edges of the reflecting surface may have a reduced reflectivity to reduce the side lobes in the focused acoustical waves. Such reduced reflectivity may be achieved, for example, by adjusting the material of the BAW body.

The shape of the reflective surface or boundary is contoured to reflect and focus acoustic waves.

It is within the contemplation of this invention that the inwardly concave reflective surfaces may be spherical, parabolic, hyperbolic, elliptical or some higher order curve. The essential parameters are that it must reflect and focus the received acoustic waves from the input transducer into the desired direction.

The acoustic-dispersive grating, found in some embodiments, which intercepts the acoustic beams, coincides with a surface of the BAW body. It may be formed on the body by any technique known to the art: by etching, by computer generated holography, by a ruling engine, or other known means.

A grating, when used, comprises a plurality of grooves with lands between the grooves. The lands and grooves may have a number of permitted contours. They may be sinusoidally shaped. They may be substantially circularly shaped. They may be rectangularly shaped. They may be triangularly shaped so they resemble a saw tooth configuration. A preferred grating is one known in the art as a blazed grating. The essential feature of the grating is that it efficiently diffract acoustic beams into a known acoustic beam distribution.

One or more acoustic receiving sensor transducer sets are positioned on the external surface of the BAW body to intercept focused acoustic waves. Each output acoustic sensor carries a plurality of juxtaposed, aligned, electrodes which are positioned at different locations on the opposite or outer surface of a piezoelectric transducer, from the BAW body, to produce a voltage only when acoustic waves within a predetermined slot of acoustic frequencies are focused on a transducer of an output transducer set. The output acoustic transducers are typically positioned so that all predetermined contiguous slots of frequencies are sensed.

Thus the properties and attributes of this invention are that it uses a BAW body having an input transducer to deliver acoustic signals to such body, at least one reflective surface on such body to reflect and focus the acoustic beam, and acoustical and steering means to steer the acoustic signals into a pattern wherein the angle of steering depends upon the frequency of the received signal. At least one acoustic output transducer set is positioned on a surface of the BAW body, and acoustic signals are focused and steered according to the frequencies of such signals, onto the output transducers of the transducer sets where prepositioned electrodes are stimulated according to the frequency slot of the frequency of the incoming signal.

It is therefore an object of this invention to receive electric signals, transduce such signals into acoustic signals and to direct such acoustic signals, according to their frequency, into an output transducer of at least one output transducer set, having predetermined sensor output signals when they are stimulated by an acoustical signal, and in which such stimulation is frequency dependent to direct stimulating acoustical signals to the positions of such transducers according to the frequency of such signals.

It is an object of the invention to convert input electrical signals into an acoustical beam, to channel such beam through a BAW body whose surface is particularly prepared to reflect and focus such signals into the positions of an output transducer of at least one transducer set such that output sensor signals are produced depending upon which predetermined frequency slot contains the input frequency.

It is also an object of this invention to use a novel phased array electrode configuration on an input transducer for a BAW body, and more particularly upon a piezoelectric transducer.

It is more specifically an object of this invention to use such an electrode configuration using interdigital juxtaposed electrodes with adjacent electrodes insulated from each other.

Other objects will become apparent from the following description taken in connection with the accompanying drawings.

BRIEF DESCRIPTION OF THE DRAWINGS

FIG. 6 is a simplified sectional view, taken at 6—6 in FIG. 1, with portions of the hatching deleted to show a beam diagram;

FIG. 7 is an expanded plan view of a typical input transducer, showing a preferred phased array electrode configuration used for beam steering in the embodiments of FIGS. 1 through 9;

FIG. 8 is a sectioned fragmentary view, taken at 8—8 of FIG. 7;

DETAILED DESCRIPTION OF THE INVENTION

The Spectrum Analyzer and Channelizer of this invention is useful in rapidly simultaneously identifying the frequency of multiple incoming radio frequency signals. Those signal might be, for example, from a communications system or from a radar system.

Figure 1:
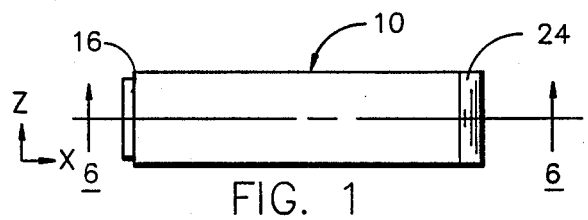
FIG. 1 is a top view of the outside of a first embodiment of the invention with a cylindrical curved mirror surface.

The shown apparatus uses a BAW body 10. The usable portions of the BAW body 10, in the embodiments of FIGS. 1 and 9, have surfaces wherein the surface elements, in the Z direction, are cylindrical. When discussing cylinders, it is customary to think of right circular cylinders. Only portions of the surface of the BAW body 10 of the invention may be circular.

Figure 3:
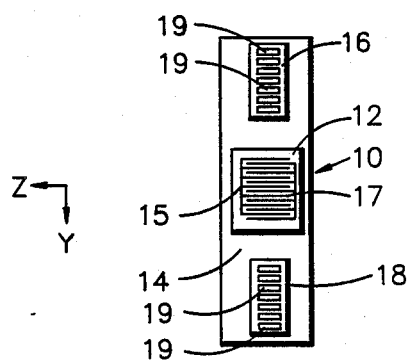
FIG. 3 is a view, taken from the left in FIG. 1.
Figure 4:
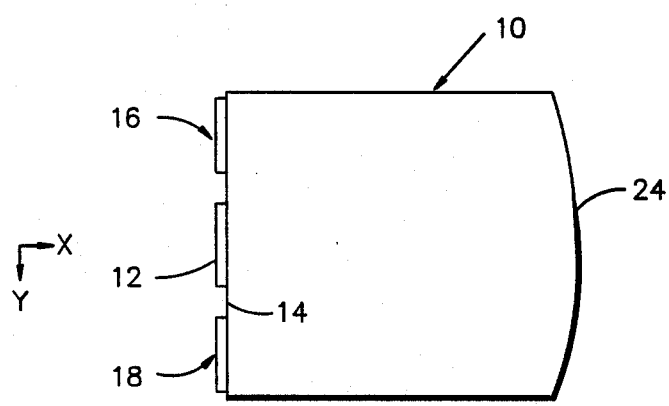
FIG. 4 is a view, taken from the bottom in FIG. 1.

It is neither a requirement that the cylinder be circular, nor that it be a right cylinder. In FIGS. 1A, 3A and 8A, the concave mirror surfaces 24 and 32 are curved in both directions so they are not cylindrical. If the curvatures in both directions were equal, the surfaces would be spherical. They may, but need not be spherical. If the curvatures were circular, but not equal, the surfaces would be ellipsoids. They may, but need not be ellipsoidal. The curved surfaces may have higher order even numbered terms of concavity, so long as the surfaces reflect and focus the acoustical beams as required.

Figure 2:
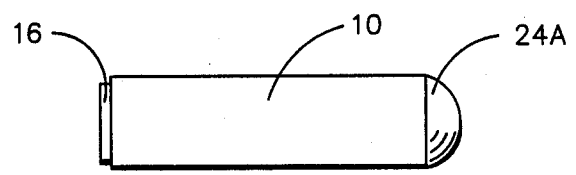
FIG. 2 is a top view of the outside of the first embodiment with a non-cylindrical curved mirror surface.
Figure 5:
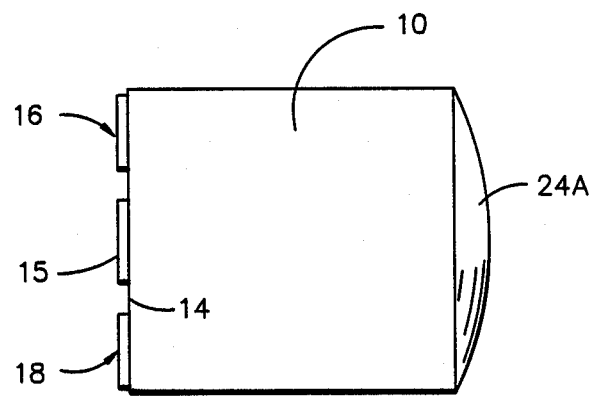
FIG. 5 is a view, taken from the bottom in FIG. 1A.
Figure 9:
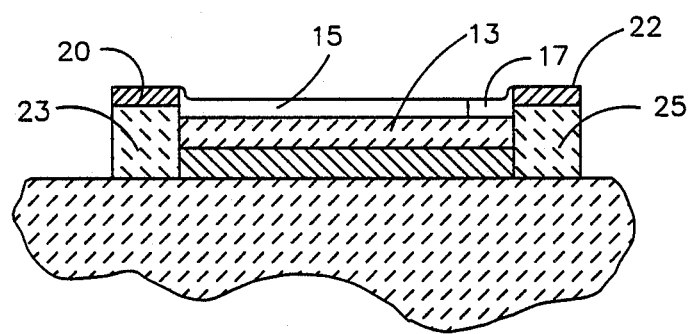
FIG. 9 is a sectioned fragmentary view, taken at 9—9 of FIG. 7.
Figure 10:
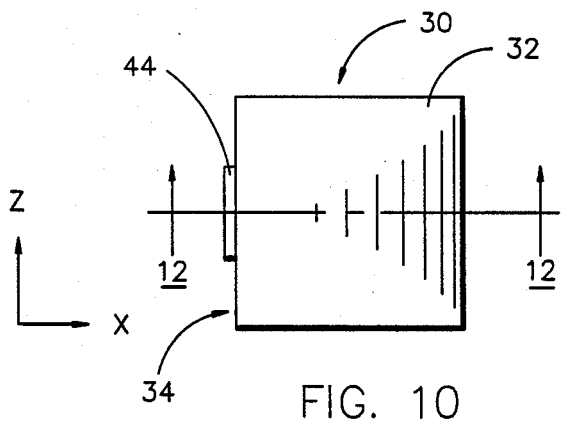
FIG. 10 is a top view of a second embodiment of the invention.
Figures 12, 13:
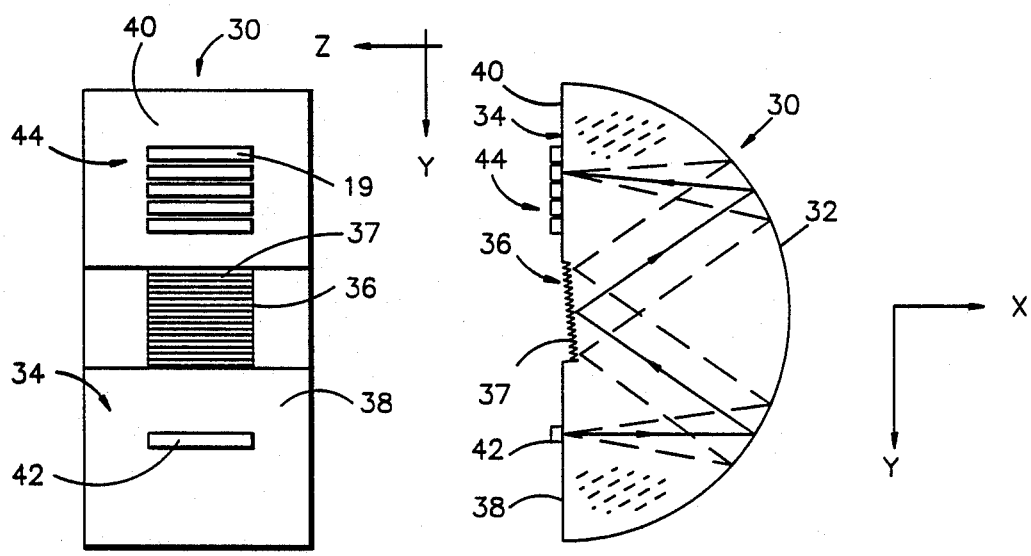
FIG. 12 is a simplified sectional view, taken at 12—12 in FIG. 10, with portion of the hatching deleted to show a beam diagram.
FIG. 13 is a view, taken from the left in FIG. 10.

In the embodiment of FIGS. 1-9, including FIGS. 2 and 5, a first transducer 12 is adapted to receive and be driven by electrical signals which are typically in the radio frequency range. The input transducer 12 is positioned on and attached by a conductive electrode 13 to a first surface 14 of the crystal 10 (FIG. 9). When transducer 12 is a platelet, it is important that the surface 14 be substantially flat only under the transducer 12. It may be convenient to have the adjacent regions also flat.

Alternatively, the piezoelectric transducer may be built or sputtered onto one surface of a common electrode which is attached in contact with the BAW body 10.

The electrode configuration on the outer surface of the input transducer 12 is a phased array (See FIGS. 7-9) having equal pluralities of uniformly spaced interdigitated, juxtaposed finger electrodes 15, 17. The finger members 15 alternate with the finger numbers 17 on the outer surface of the transducer 12. An input voltage is connected (not shown) to members 15 and 17 so that their voltages are oppositely phased. All of the members 15 are attached to a common conductive side rod 20, and all the members 17 are connected to a common conductive side rod 22. The connectors 20, 22 are not positioned on the piezoelectric material 12, but are spaced away from the piezoelectric material 12, whereby they create only a relatively small electric field intensity within the piezo-electric vibrator are supported upon refractive pedestals 23, the electrodes 15 and 17 alone are a phased array to produce the required frequency dependent beam steering.

Instead of attaching the transducer 12, such transducer may be grown or sputtered onto such body 10 with electrodes deposited, as required. A common electrode 13 may be formed on the surface of the BAW body 10, and the piezoelectric material 12 may be grown or sputtered onto such electrode 13. The phased array system of electrodes 15 and 17 are arranged in a pattern on the outer surface of the piezoelectric material. The conductive side rods 20, 22 carry voltage and current to the electrodes 15 and 17, respectively.

Two sets 16 and 18 of output transducers are positioned and attached, along the Y axis, to the surface 14 on opposite sides of the input transducer 12. Preferably, the two output transducer sets are configured and positioned so that each output transducer detects signals in different frequency slots. That is, the outer surface electrodes 19 of the two transducers are preferably staggered so that they are positioned about one-half of a spacing period apart, in the Y direction and their frequency slots on each separate transducer set do not overlap. Instead, they overlap with the adjacent frequency slots corresponding to electrodes on the other output transducer set. In the first embodiment of the analyzer channelizer, in the output transducer sets 16, 18, a piezoelectric crystal 21 (not shown in detail) is attached by a metallic conducting sheet 13 to the surface 14. On the outer sides of the piezoelectric crystal are a plurality of juxtaposed but spaced-apart electrodes 19 aligned in a row in the Y direction. As the frequency of the incoming signal changes, the focal point for the acoustic wave moves in the direction of the Y axis from the vicinity of one row electrode to another row electrode, thereby inducing a voltage across the piezoelectric crystal between a particular electrode, corresponding to the acoustical frequency, and a sheet of common conducting material. The surface 24 of the BAW body 10, in the X direction, opposite the surface 14 is rounded and polished to reflect and focus acoustic waves from the input transducer 12 toward the output transducer sets 16 and 18. The position, in the Y direction, of focusing of the acoustic wave on the output transducers 16, 18 depends upon the frequency of the input signal. The acoustic beam is focused by the curved cylindrical or spherical surface 24. The radius of surface 24 is selected so that the locus of the focal points, over the pass band, coincides with the output transducer sets plane. The curved reflecting surface acts as a concave reflecting mirror. When, for convenience, the surface is circularly cylindrical, its foci are located a distance R/2 from its apex, and the reflector of radius R acts like a lens of focal length equal to R/2.

In a typical apparatus of the type shown in FIGS. 1–9, operating with input frequencies between 100 and 200 MHz, the BAW BODY 10 might be fabricated of fused silica. The radius of curvature for the surface 24 might be on the order of 50 millimeters. The zero order or undiffracted beams are suppressed, reducing interference, by driving adjacent input electrodes out of phase with oppositely poled signals.

Figure 11:
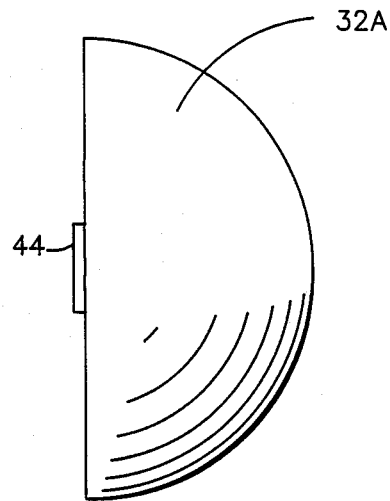
FIG. 11 is a top view of the second embodiment with a non-cylindrical concave mirror surface.

In operation of the embodiment of FIGS. 1–9, a radio frequency source (not shown) is connected between the electrodes 15 and 17, causing alternating electric fields to be concentrated across the surfaces of the piezoelectric material 12. The adjacent alternating fields are oppositely poled to launch steered acoustic waves, at the radio frequency, into the body 10 (See FIG. 6). With the new phased array electrode pattern, not only is the undiffracted mode of acoustical waves suppressed, but also two beams of first order waves are launched symmetrically, with equal components in the X directions and with equal but oppositely poled components in the Y directions. The two first order beams are reflected from the interface between the body 10 and the atmosphere at the circularly cylindrical surface 24 which reflects and focuses the acoustical beams onto the output transducer sets 16 and 18. Note that waves from all parts of the input transducer are focused at one spot on each of the two output transducer sets 16 and 18. A voltage is generated on the electrode 19, opposite the focused spot, on the outer surface of its respective transducer, and that electrode corresponds to a particular frequency slot of the input radio frequency spectrum. Should a signal of a second frequency arrive, it would focus on a different position, in the Y direction, of the transducer sets 16 and 18 which would energize a second electrode of those transducers corresponding to a second radio frequency slot. The electronic processing of the signals produced on the various electrodes of the transducer sets 16 and 18 will be discussed below during the discussing of the typical electronics block diagram of FIG. 11.

In the embodiment of FIGS. 1–9, both of the output transducer sets 16 and 18 could have had almost touching electrodes 19, and both transducer sets would have produced an output that is a measure of the frequency slot corresponding to the frequency of the received signal. In a variation of the first embodiment (not shown) using only one of the two output transducer sets 16, 18, it would be necessary to construct the output transducer with such almost touching electrodes.

However, with two output transducers, as shown, it is preferable to space the electrodes so that each signal registers only on one output transducer, and crosstalk between electrodes, for a given frequency input signal, would be eliminated.

A second embodiment of the invention is shown in FIGS. 10–13. The BAW body structure 30 is formed with a concave reflecting surface 2. It need not necessarily be circular. The surface 32 is shown with cylindrical elements in the Z direction, but it need not necessarily be cylindrical. The surface 32 could, for example, be spherical or some other concave shape. The surface 34 is divided across the diameter, in the Y direction, into three sectors. The central sector 36 is slightly tilted, about the Z axis, to cause the grating 37 to cooperate with the reflecting surface 32 so that the beam reflected from surface 32 does not restrike the grating 37. Although the reflection grating 37 may have teeth of any known shape, the grating spacing is usually uniform. Typical teeth shapes are sinusoidal, rectangular, and saw-toothed. The grating 37 is preferably a blazed grating.

Two radially outward sectors 38 and 40 are positioned along the Y direction on opposite sides of the central sector 36.

The first radially outward sector 38 carries an input transducer 42 which is, typically, a single Z-directed electrode on the outer surface of piezoelectric crystal apparatus astride the Y axis.

The second radially outward sector 40 carries an output transducer 44 which is a single piezo electric crystal astride the Y axis with a plurality of Z-directed electrodes aligned along the Y axis on its outer face. The electrodes are not necessarily equally spaced. Each electrode is assigned a frequency slot as in the first embodiment of FIGS. 1–9.

In this second embodiment, a polarized, blazed, reflection grating 37, manufactured on a, preferably flat, surface, steers the bulk acoustic wave incident upon it. The input transducer electrode 42 is held to a sufficiently small thickness, in the diametral or Y direction of the BAW body 30, to cause the acoustic waves incident on the grating 37 to have a substantially constant phase front. The curved reflecting surface 32 acts to collimate plane waves. Acoustic waves from the reflecting grating 37 are focused by the reflecting surface 32 onto the output transducer 44 adjacent one of the surface electrodes. Each surface electrode of the output transducer corresponds to a particular radio frequency slot.

In operation, an electrical signal at a radio frequency is delivered from a source (not shown) to the electrode of the input transducer 42. The input transducer 42 launches diverging acoustical beams into the BAW body 30. The diverging beams are collimated by the reflecting circular surface 32, and they are directed toward the reflecting grating 37. The grating 37 is frequency-sensitive, and the direction of its reflection depends upon the frequency of the acoustical wave. Acoustical beams from the reflection grating 37 are focused by the reflecting surface 32 onto one region of the transducer set 44 adjacent one of the surface electrodes 19. The position of the focus of the acoustical waves depends upon the frequency of such waves. Thus, only one electrode 19, corresponding to a particular frequency slot, is energized. The further processing of signals from the output transducer electrodes 19 is discussed below in connection with the discussion of the electronics circuit of FIG. 11.

Figure 14:
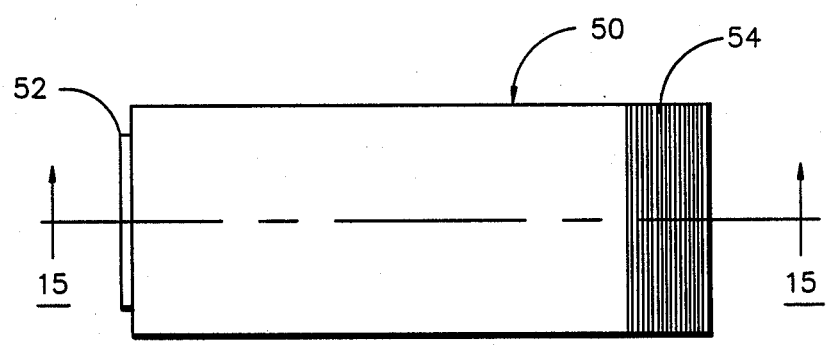
FIG. 14 is a top view of a third embodiment of the invention.
Figure 15:
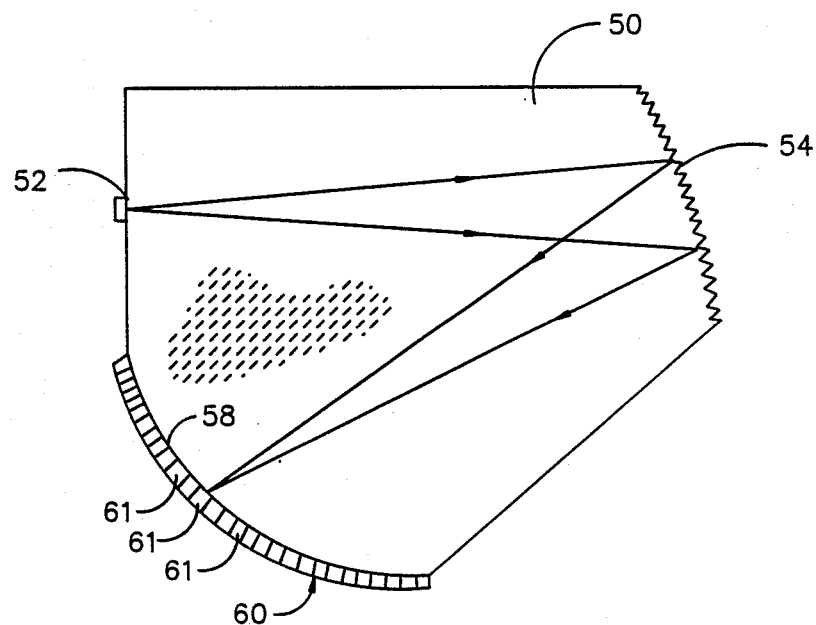
FIG. 15 is a simplified sectional view, taken at 15—15 of FIG. 14, with portions of the hatching removed to show a beam diagram.

By analogy to optical spectrometers using concave gratings, and particularly to such an arrangement known as the Rowland arrangement, a fourth embodiment of the invention is conceived and shown in FIGS. 14 and 15. Optical Rowland arrangements are shown at page 412 of the book, "Principle of Optics," Third Edition, Pergamon Press, New York, 1965.

In the embodiment of FIGS. 14 and 15, to obtain sharp lines at the output transducer 60, the output transducer 60 and the input transducer 52 are both positioned on a circle that is tangent to the grating 54. The diameter of such circle is equal to the radius of curvature of the concave grating 54.

Acoustic beams are launched into the BAW body 50 from the input transducer 52. The diverging acoustic beams travel through the body 50, and they impinge on a curved reflection grating 54 formed on a curved, usually circularly cylindrical surface. The curved reflection grating 54 reflects the acoustic wave and focuses it onto another curved surface 58. The position of focusing on the second curved surface depends upon the frequency of the wave at the input transducer 52. On the outer side of the surface 58 are positioned an output transducer set having a plurality of outer electrodes 61. Each electrode 61 corresponds to a particular transducer and a particular acoustic frequency. Thus, each electrode corresponds to a particular radio frequency slot for the input signal. The acoustic beam is steered according to the frequency of the input radio frequency. The steering is analogous to a frequency-scanned phased-array radio frequency antenna in the reflection mode. The groove spacing of the grating 54 is selected such that the reflected wavefronts add in phase in a given direction depending on the radio frequency. If two or more signals at different frequencies appear at the input transducer, the same number of separate beams are created, and each beam propagates to a different part of the transducer set 60 according to its frequency.

In operation of the embodiment of FIGS. 14 and 15, a radio frequency voltage is delivered from a source (not shown) to the outer electrode of the input transducer 52. The transducer 52 launches an acoustic wave into the BAW body 50 toward the concave grating 54 which reflects the acoustic wave and focuses it on the surface 58. The position of the focusing on the surface 58 depends upon the frequency of the received radio frequency signal. A particular transducer and its associated electrode 61 on the outer surface of the transducer set 60 is excited for each signal whose frequency falls within the frequency slot assigned to that electrode.

Typical transducer material for a flat transducer is a bonded platelet X-cut Lithium Niobiate transducer. Another frequently used material for a transducer is stoichiometric magnesium aluminate spinel. For a transducer on a curved surface such as in FIG. 12, a thin film type transducer such as zinc oxide must be used.

The second and third embodiments use a reflection grating to disperse the acoustic waves. The path length for the second embodiment is twice that of the first embodiment, and the beam length is reflected three times in the second embodiment compared to once in the first embodiment. Thus, material-attenuation and reflection losses are higher in the second than in the first embodiment, and this propertyi may therefore be advantageous for triple transit suppression.

Figure 16:
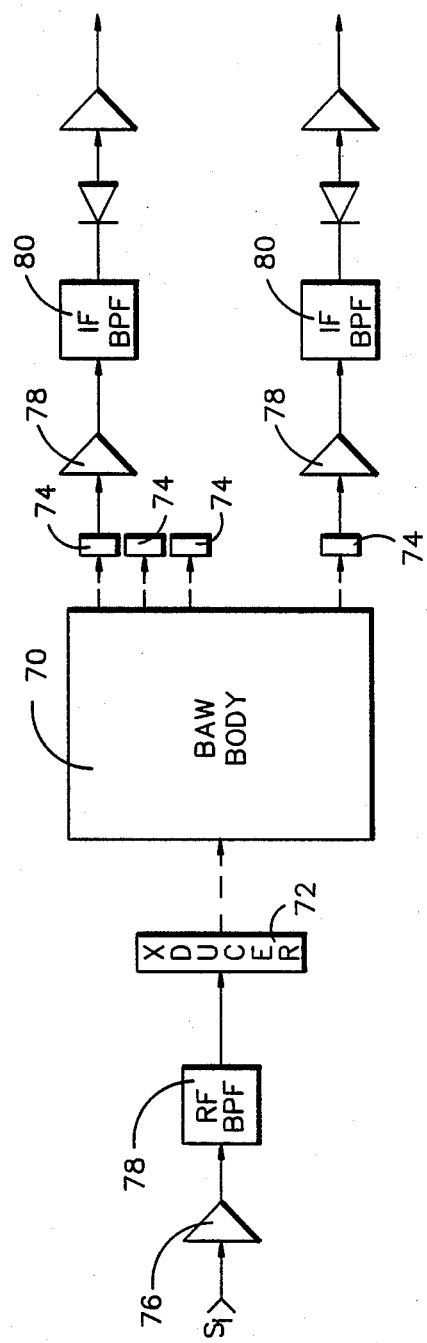
FIG. 16 is a block diagram of a typical set of electronics usable with the apparatus of this invention.

Typical electronics useful with the embodiments of the invention is shown in FIG. 16. In the FIG. 16, the "BAW MEDIUM" 70 is the previously described Bulk Acoustic Wave apparatus of the invention. The input transducer is shown at 72, and the plurality of electrodes and their transducers of the output transducer set are shown at 74. Each of the channels connected to the individual electrodes of the output transducer set 74 is connected to a separate output channel. Since the output channels are identical, only one need be explained.

A radio frequency signal, $S_i$, is connected through a radio frequency amplifier 76 and a radio frequency bandpass filter 78 to the input transducer 72.

The output transducers 74 are each connected through an intermediate frequency amplifier 78 and an intermediate frequency bandpass filter 80, and thence to a detector.

The invention is not to be limited by the above description, but only according to the above description taken together with the accompanying claims.

We claim:

1. A bulk acoustic wave spectrum analyzer and channelizer, comprising:
   a bulk acoustic wave body having the property of conducting bulk acoustic wave beams;
   said body having at least one inwardly concave acoustically reflecting and focusing surface and an orthogonal X-Y-Z coordinate system, defined on said body;
   an input transducer, positioned upon one surface of said body to launch beams having both an X and a Y component into said body;
   said acoustically reflecting surfaces include a portion of one concave inward surface, positioned to receive acoustic beams launched in X-Y directions from said input transducer;
   two output transducer sets, said output transducers being symmetrically positioned on opposing sides of said input transducer, in the Y direction, and each has said plurality of juxtaposed Z-directed electrodes aligned in a row in the Y direction and positioned to receive steered beams from said reflecting surface.
   frequency responsive means for steering acoustic beams launched from said input transducer into said body, in response to the frequencies of received radio frequency signals, to focus said beams onto frequency dependent positions of said output transducers of said output transducer sets to produce usable electrical output signals upon no more than one electrode of each said set of juxtaposed electrodes for each frequency of received signals, said particular energized electrodes being measures of the frequency slots that include the frequencies of said received radio frequency signals delivered to said input transducer.

2. A bulk acoustic wave spectrum analyzer and channelizer, comprising:

a bulk acoustic wave body having the property of conducting bulk acoustic wave beams in which an orthogonal X-Y-Z coordinate system is defined;

an input transducer, positioned upon one surface of said body, having an electrode phased array configuration positioned thereon for receiving radio frequency electrical signals, launching and steering said acoustic beams with both an X and a Y component, in response to the frequency of said signals, into said body;

said body having a first inwardly concave surface on said body, positioned to receive acoustic beams from said input transducer;

a diffraction grating, intercepting beams from said first concave surface for further steering acoustic beams in response to the frequencies of received radio frequency signals;

said body having a second inwardly concave surface, positioned to receive diffracted acoustic beams from said grating;

at least one set of output transducers, including a plurality of aligned, juxtaposed electrodes which are Z-directed and aligned in a row along the Y direction of said coordinate system, defining the transducers of each said set;

said input transducer steering beams to said first concave surface which reflects them onto said grating, said grating diffracting and steering said beams onto said second concave surface which reflects them onto at least one transducer of said output transducer set;

thereby to focus said beams onto frequency dependent positions of said output transducers of said output transducer sets to produce usable electrical output signals upon no more than two electrodes of said plurality of juxtaposed electrodes for each frequency of received signals, said particular energized electrodes being measures of the frequency slots that include the frequencies of said received radio frequency signals delivered to said input transducer.

3. A transducer as recited in claim 2 in which said grating is a computer generated holographic grating to control the dispersed reflected beam.

4. A transducer as recited in claim 2 in which said grating is a blazed grating.

5. Apparatus as recited in claim 4 in which said grating has sinusoidally shaped teeth.

6. Apparatus as recited in claim 4 in which said grating has rectangularly shaped teeth.

7. Apparatus as recited in claim 4 in which said grating has saw-shaped teeth.

8. Apparatus as recited in claim 2 wherein said input transducer and said output transducer sets are on the Y-Z plane, with said grating between them;

the plane of said grating is nominally the Y-Z plane, but tilted slightly about the Z axis to prevent grating-diffracted beams from re-striking said grating.

9. Apparatus as recited in claim 8 in which said concave surfaces are cylindrical surfaces having their parallel elements in the Z direction, and said output transducer sets and said diffraction grating are on a cylindrical surface.

10. Apparatus as recited in claim 9 in which said cylindrical surfaces are circular.

11. Apparatus as recited in claim 10 in which said circularly cylindrical surfaces are right.

12. Apparatus as recited in claim 9 in which said apparatus has a Rowland configuration.

13. Apparatus as recited in claim 1 wherein said input transducer comprises:

A piezoelectric layer, attached to said body by a common electrode on an inner first face thereof; and a phased array electrode structure having a plurality of substantially equally-spaced parallel Z-directed electrically conductive elements, each conductively attached to separate substantially parallel Y-directed attaching side-rods, said Z-directed elements being attached to the outer surface of said layer said Y-directed side rods being mounted away from said body on insulated pedestals.

14. Apparatus as recited in claim 1 wherein said input transducer comprises:

A piezoelectric layer, attached to said body by a common electrode on an inner first face thereof; and a phased array electrode structure having a plurality of substantially equally-spaced parallel Z-directed electrically conductive elements, each conductively attached to separate substantially parallel Y-directed attaching side-rods, said Z-directed elements being attached to the outer surface of said layer said Y-directed side rods being mounted away from said body on insulated pedestals.

* * * * *